US008829542B2

(12) United States Patent
Lee et al.

(10) Patent No.: US 8,829,542 B2
(45) Date of Patent: Sep. 9, 2014

(54) ORGANIC LIGHT EMITTING DIODE DEVICE

(75) Inventors: Sung-Hun Lee, Yongin (KR); Jung-Bae Song, Yongin (KR)

(73) Assignee: Samsung Display Co., Ltd., Yongin, Gyeonggi-Do (KR)

(*) Notice: Subject to any disclaimer, the term of this patent is extended or adjusted under 35 U.S.C. 154(b) by 577 days.

(21) Appl. No.: 12/926,663

(22) Filed: Dec. 2, 2010

(65) Prior Publication Data
US 2011/0133226 A1 Jun. 9, 2011

(30) Foreign Application Priority Data

Dec. 4, 2009 (KR) .................. 10-2009-0120032

(51) Int. Cl.
H01L 29/20 (2006.01)
H01L 33/00 (2010.01)
H01L 51/52 (2006.01)
H01L 27/32 (2006.01)
H01L 51/50 (2006.01)

(52) U.S. Cl.
CPC ....... *H01L 51/5278* (2013.01); *H01L 2251/552* (2013.01); *H01L 27/3211* (2013.01); *H01L 51/5036* (2013.01); *H01L 27/3213* (2013.01)
USPC .................................. 257/89; 257/E51.002

(58) Field of Classification Search
CPC ................. H01L 27/3206; H01L 27/3209
USPC ............................. 257/89, E51.002
See application file for complete search history.

(56) References Cited

U.S. PATENT DOCUMENTS

| 6,107,734 | A | 8/2000 | Tanaka et al. |
| 6,337,492 | B1 | 1/2002 | Jones et al. |
| 6,872,472 | B2 | 3/2005 | Liao et al. |
| 7,420,203 | B2 | 9/2008 | Tsutsui et al. |
| 7,473,923 | B2 | 1/2009 | Tsutsui et al. |
| 2005/0110005 | A1* | 5/2005 | Forrest et al. ............. 257/40 |
| 2006/0214565 | A1 | 9/2006 | Luo et al. |
| 2006/0227079 | A1* | 10/2006 | Kashiwabara ............ 345/76 |
| 2007/0181887 | A1* | 8/2007 | Kijima et al. ............. 257/79 |
| 2008/0160669 | A1* | 7/2008 | Blochwitz-Nimoth et al. 438/99 |
| 2009/0001327 | A1* | 1/2009 | Werner et al. ............ 252/512 |
| 2009/0009071 | A1 | 1/2009 | Murano et al. |
| 2009/0026929 | A1 | 1/2009 | Song et al. |
| 2010/0052527 | A1* | 3/2010 | Ikeda et al. .............. 313/504 |

FOREIGN PATENT DOCUMENTS

| CN | 1551707 | 12/2004 |
| CN | 1943277 | 4/2007 |
| CN | 101379884 | 3/2009 |
| CN | 101490867 | 7/2009 |

(Continued)

*Primary Examiner* — Matthew Landau
*Assistant Examiner* — Igwe U Anya
(74) *Attorney, Agent, or Firm* — Lee & Morse, P.C.

(57) ABSTRACT

An organic light emitting diode device including an anode, a cathode facing the anode, and a light emitting member between the anode and cathode, wherein the light emitting member includes at least two light emitting units displaying the same or different color as one another, and a charge-generation layer between the at least two light emitting units, the charge-generation layer including a first charge-generation layer and a second charge-generation layer that each include an undoped material, and wherein the first charge-generation layer has an ionization energy that is about the same as or less than an electron affinity of the second charge-generation layer.

18 Claims, 8 Drawing Sheets

(56) References Cited

FOREIGN PATENT DOCUMENTS

| | | |
|---|---|---|
| JP | 2004/334199 A | 11/2004 |
| JP | 2005/072012 A | 3/2005 |
| JP | 2005-339823 A | 12/2005 |
| JP | 2006-073484 A | 3/2006 |
| JP | 2006/127985 A | 5/2006 |
| JP | 2006/339135 A | 12/2006 |
| JP | 2006/351398 A | 12/2006 |
| JP | 2007-027092 A | 2/2007 |
| JP | 2007-242601 A | 9/2007 |
| JP | 2009-521109 A | 5/2009 |
| KR | 10-0132294 B1 | 12/1997 |
| KR | 10 2007-0027796 A | 3/2007 |
| KR | 10 2007-0067155 A | 6/2007 |
| KR | 10 2007-0111061 A | 11/2007 |
| KR | 10 2008-0095244 A | 10/2008 |
| KR | 10 2008-0105640 A | 12/2008 |
| WO | WO 2008/010161 A2 | 1/2008 |

\* cited by examiner

FIG.3

| B | W | B | W | B |
|---|---|---|---|---|
| G | R | G | R | G |
| B | W | B | W | B |
| G | R | G | R | G |
| B | W | B | W | B |

ORGANIC LIGHT EMITTING DIODE DEVICE

BACKGROUND

1. Field

Embodiments relate to an organic light emitting diode device.

2. Description of the Related Art

Recently, an organic light emitting diode (OLED) device is drawing attention as a display device and a lighting apparatus.

An organic light emitting diode device may include two electrodes and an emission layer interposed therebetween. Electrons injected from one electrode may be combined with holes injected from another electrode in an emission layer to generate excitons, which release energy in the form of emitted light.

Since the organic light emitting diode device emits light in itself without a separate light source, it has very low power consumption as well as excellent response speeds, viewing angles, and contrast ratios. Such an organic light emitting diode device may be desirable, inter alia, to improve current characteristics and therefore reduce a driving voltage and to heighten luminance.

SUMMARY

Embodiments are directed to an organic light emitting diode device, which substantially overcome one or more of the problems due to the limitations and disadvantages of the related art.

It is a feature of an embodiment to provide an organic light emitting diode device that has improved current characteristics, a lowered driving voltage, and high luminance.

At least one of the above and other features and advantages may be realized by providing an organic light emitting diode device including an anode, a cathode facing the anode, and a light emitting member between the anode and cathode, wherein the light emitting member includes at least two light emitting units displaying the same or different color as one another, and a charge-generation layer between the at least two light emitting units, the charge-generation layer including a first charge-generation layer and a second charge-generation layer that each include an undoped material, and wherein the first charge-generation layer has an ionization energy that is about the same as or less than an electron affinity of the second charge-generation layer.

The first charge-generation layer may have an electron transport property and the second charge-generation layer may have a hole transport property.

The first charge-generation layer may be between the anode and the second charge-generation layer.

The at least two light emitting units may include a first light emitting unit between the anode and the first charge-generation layer; and a second light emitting unit between the cathode and the second charge-generation layer.

The first charge-generation layer and the second charge-generation layer may include different materials from one another.

The first charge-generation layer may have an ionization energy, the ionization energy being from about the same as to about 5 eV less than an electron affinity of the second charge-generation layer.

The ionization energy may be from about 1 eV less to about 4 eV less than the electron affinity of the second charge-generation layer.

The first charge-generation layer may have an ionization energy of about 2.0 eV to about 5.0 eV and the second charge-generation layer may have an electron affinity of about 4.0 eV to about 7.0 eV.

The first charge-generation layer may include a compound including at least one of a metal-substituted tetra(hexahydropyrimidopyrimidine), an alkali metal, and an alloy of an alkali metal.

The first charge-generation layer may include the metal-substituted tetra(hexahydropyrimidopyrimidine), such metal-substituted tetra(hexahydropyrimidopyrimidine including at least one of ditungsten tetra(hexahydropyrimidopyrimidine) ($W_2(hpp)_4$) and dichromium tetra(hexahydropyrimidopyrimidine) ($Cr_2(hpp)_4$).

The first charge-generation layer may include the alkali metal, such alkali metal including at least one of lithium (Li), sodium (Na), cesium (Cs), rubidium (Rb), and francium (Fr).

The second charge-generation layer may include at least one of a hexaazatriphenylene derivative, a tetrafluoro-tetracyanoquinodimethane (F4-TCNQ) derivative, and a metal oxide.

The second charge-generation layer may include the metal oxide, such metal oxide including at lest one of vanadium oxide ($V_2O_5$), tungsten oxide ($WO_3$), and molybdenum oxide ($MoO_3$).

Each light emitting unit may include an emission layer displaying color; and an auxiliary layer disposed on at least one of an upper side and a lower side of the emission layer.

The light emitting member may include at least one of a red light emitting unit, a green light emitting unit, a blue light emitting unit, an orange light emitting unit, and a white light emitting unit.

The light emitting member may include the orange light emitting unit, such orange light emitting unit including a red emission layer and a green emission layer.

The light emitting member may include the orange light emitting unit, such orange light emitting unit including a host doped with red light emitting material and green light emitting material.

The light emitting member may be fashioned to emit white light by combining light emitted from the at least two light emitting units.

The organic light emitting diode device may further include a first sub-pixel, a second sub-pixel, and a third sub-pixel displaying different colors from each other and a white sub-pixel, wherein the light emitting member is commonly disposed on the first sub-pixel, the second sub-pixel, the third sub-pixel, and the white sub-pixel; and wherein the first sub-pixel, the second sub-pixel, and the third sub-pixel include a red color filter, a green color filter, and blue color filter, respectively, disposed on a lower side or an upper side of the light emitting member.

BRIEF DESCRIPTION OF THE DRAWINGS

The above and other features and advantages will become more apparent to those of ordinary skill in the art by describing in detail exemplary embodiments with reference to the attached drawings, in which:

FIG. 3 illustrates a top plan view of an arrangement of a plurality of pixels in the organic light emitting diode device of FIG. 1;

DETAILED DESCRIPTION

Figure 1:
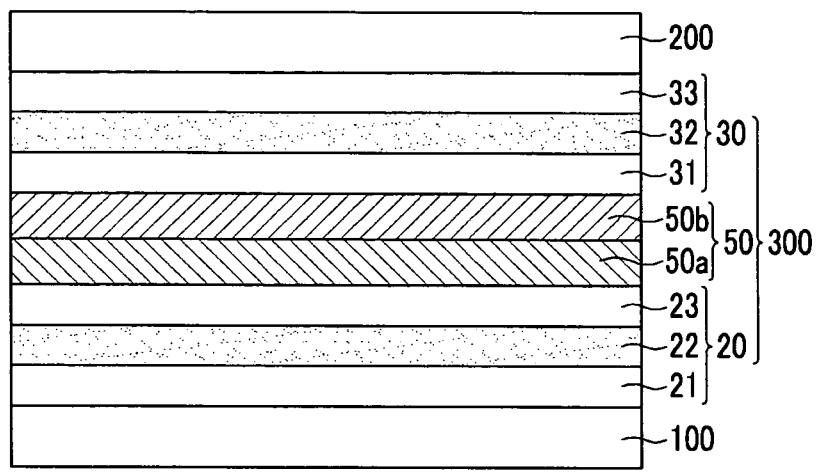
FIG. 1 illustrates a cross-sectional view of an organic light emitting diode device according to an embodiment.

Korean Patent Application No. 10-2009-0120032, filed on Dec. 14, 2009, in the Korean Intellectual Property Office, and entitled: "Organic Light Emitting Diode Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

This disclosure will be described more fully hereinafter with reference to the accompanying drawings, in which exemplary embodiments of this disclosure are shown. As those skilled in the art would realize, the described embodiments may be modified in various different ways, all without departing from the spirit or scope of this disclosure.

Referring to FIG. 1, an organic light emitting diode device according to an embodiment is described in detail.

FIG. 1 illustrates a cross-sectional view of an organic light emitting diode device according to an embodiment.

Referring to FIG. 1, the organic light emitting diode (OLED) device according to the present embodiment may include an anode 100 and a cathode 200 facing each other. An organic light emitting member 300 may be interposed between the anode 100 and cathode 200.

At least one of the anode 100 and the cathode 200 may be a transparent electrode. When the anode 100 is a transparent electrode, the OLED device may be a bottom emission device that emits light toward a bottom side. When the cathode 200 is a transparent electrode, the OLED device may be a top emission device that emits light toward a top side. However, when the anode 100 and the cathode 200 are changed in their upper and lower disposition, the bottom emission and the top emission configuration may be shifted. In addition, when both the anode 100 and the cathode 200 are transparent electrodes, the OLED device may be a both side emission device that emits light toward the lower and upper sides.

In an implementation, the transparent electrode may be formed of, e.g., ITO, IZO, or a combination thereof. In another implementation, the transparent electrode may be formed of, e.g., aluminum (Al), silver (Ag), or a combination thereof, and may have a thin configuration. When the anode 100 or the cathode 200 is an opaque electrode, it may be formed of an opaque metal, e.g., aluminum (Al), silver (Ag), or the like.

The organic light emitting member 300 may include a plurality of light emitting units 20 and 30 and a charge-generation layer 50 between the plurality of light emitting units 20 and 30.

The plurality of light emitting units 20 and 30 may display different light colors from each other. It is also possible to emit white light by combining lights emitted from the light emitting units 20 and 30.

The first light emitting unit 20 may include an emission layer 22 emitting light of the visible ray region and auxiliary layers 21 and 23 disposed on lower and upper sides of the emission layer 22. One auxiliary layer 21 may include at least one of a hole injection layer (HIL) and a hole transport layer (HTL). The other auxiliary layer 23 may include at least one of an electron injection layer (EIL) and an electron transport layer (ETL). In an implementation, at least one of the auxiliary layers 21 and 23 may be omitted.

The second light emitting unit 30 may include an emission layer 32 emitting light of the visible ray region and auxiliary layers 31 and 33 disposed on upper and lower sides of the emission layer 32. One auxiliary layer 31 may include at least one of a hole injection layer (HIL) and a hole transport layer (HTL). The other auxiliary layer 33 may include at least one of an electron injection layer (EIL) and an electron transport layer (ETL). In an implementation, at least one of the auxiliary layers 31 and 33 may be omitted.

The first light emitting unit 20 and the second light emitting unit 30 may each independently include, e.g., a red light emitting unit emitting red light, a green light emitting unit emitting green light, a blue light emitting unit emitting blue light, an orange light emitting unit emitting orange light, or a white light emitting unit emitting white light by combining light emitted from two light emitting units selected therefrom.

For example, the first light emitting unit 20 may be a blue light emitting unit and the second light emitting unit 30 may be an orange light emitting unit.

An orange emission layer included in the orange light emitting unit may be, e.g., a single layer emitting one color or at least two layers, i.e., multi-layers, each layer emitting a different color from the other layer(s).

When the orange emission layer is a single layer, the orange emission layer may be formed of a light emitting material emitting orange light having a wavelength of about 550 nm to about 650 nm.

In an implementation, the orange emission layer may include a host material doped with a red light emitting material and a green light emitting material. In this case, the host material may include a material used for a host of a green emission layer or a material having higher triplet energy than the dopant. The dopant may include a phosphorescence material.

When the orange emission layer has a multi-layer structure, the orange emission layer may include a red emission layer emitting light in the red wavelength region and a green emission layer emitting light in the green wavelength region. In this case, a host of the red emission layer may exhibit hole transport properties and may include, e.g., a triphenylamine derivative. A host of the green emission layer may exhibit electron transport properties and may include, e.g., a spirofluorene derivative.

The charge-generation layer 50 may be a layer capable of providing an electron-hole pair. The generated electron and hole may be separated and transported into the first light emitting unit 20 and the second light emitting unit 30, respectively.

The charge-generation layer 50 may include a first charge-generation layer 50a and a second charge-generation layer 50b, which may be stacked. The first charge-generation layer 50a may be positioned between the anode 100 and the second charge-generation layer 50b. The second charge-generation layer 50b may be positioned between the cathode 200 and the first charge-generation layer 50a. Accordingly, for each electron-hole pair produced by the charge-generation layer 50, an electron may be transported into the first light emitting unit 20 adjacent to the anode 100 and a hole may be transported into the second light emitting unit 30 adjacent to the cathode 200.

In particular, the first charge-generation layer 50a may exhibit electron transport properties. Accordingly, electrons generated from the charge-generation layer 50 may be passed to the first light emitting unit 20 through the first charge-generation layer 50a and may be combined with holes transported from the anode 100 in the emission layer 22 to provide an exciton and to emit light in the visible ray region by releasing energy.

The second charge-generation layer 50b may exhibit hole transport properties. Accordingly, holes generated from the charge-generation layer 50 may be passed through the second charge-generation layer 50b and transported to the second light emitting unit 30 and may be combined with electrons transported from the cathode 200 in the emission layer 32 to provide an exciton and emit light in the visible ray region by releasing energy.

Figure 2:
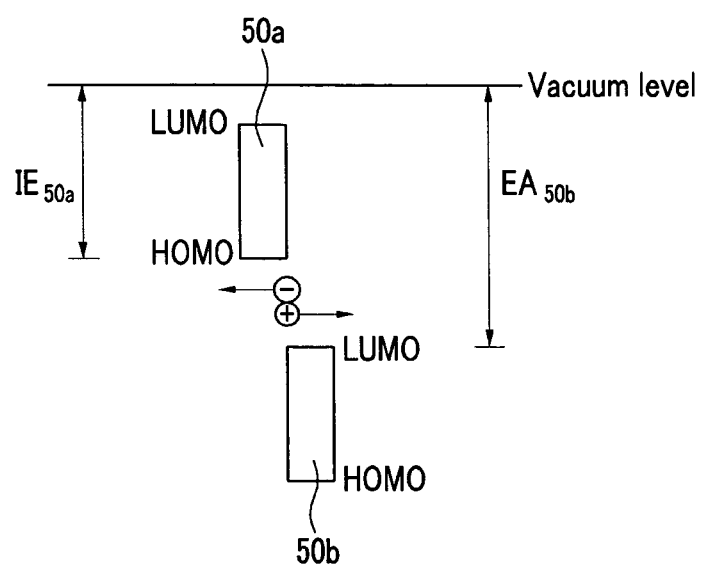
FIG. 2 illustrates a schematic view of energy levels of charge-generation layer in the organic light emitting diode device of FIG. 1.

The first charge-generation layer 50a and the second charge-generation layer 50b may have a junction structure having an energy level as illustrated in FIG. 2 to facilitate transporting electrons and holes, respectively.

Electron and hole transport will be described with reference to FIG. 2 together with FIG. 1.

FIG. 2 illustrates a schematic diagram showing energy levels of the charge-generation layer 50 in the organic light emitting diode device.

The first charge-generation layer 50a and the second charge-generation layer 50b may each have a HOMO (highest occupied molecular orbital) energy level and a LUMO (lowest unoccupied molecular orbital) energy level. An energy band gap may be an energy value between the HOMO energy level and the LUMO energy level of each layer.

With a vacuum level as a reference, an ionization energy (IE) may be defined as the absolute value of energy from the vacuum level to the HOMO energy level; and the electron affinity (EA) is defined as the absolute value from the vacuum level to the LUMO energy level.

An ionization energy ($IE_{50a}$) of the first charge-generation layer 50a may be about the same as or less than an electron affinity ($EA_{50b}$) of the second charge-generation layer 50b. Since the ionization energy ($IE_{50a}$) of the first charge-generation layer 50a may be about the same as or less than electron affinity ($EA_{50b}$) of the/second charge-generation layer 50b, the electron-hole pair may be generated at an interface between the first charge-generation layer 50a and the second charge-generation layer 50b, even when applying only a small electric field from outside. The generated electron and hole may be transported into the first charge-generation layer 50a and the second charge-generation layer 50b, respectively, without an energy barrier, so as to decrease a voltage drop applied from outside. Thus, the electron and the hole generated at the interface between the first charge-generation layer 50a and the second charge-generation layer 50b (having a junction structure that facilitates transporting them to the opposite direction) may help ensure that it is possible to decrease the voltage drop applied from outside and thereby lower the driving voltage.

The ionization energy ($IE_{50a}$) of the first charge-generation layer 50a and the electron affinity ($EA_{50b}$) of the second charge-generation layer 50b may vary depending upon materials thereof. In an implementation, the ionization energy ($IE_{50a}$) of the first charge-generation layer 50a may be about 2.0 eV to about 5.0 eV; and the electron affinity ($EA_{50b}$) of the second charge-generation layer 50b may be about 4.0 eV to about 7.0 eV. The ionization energy ($IE_{50a}$) of the first charge-generation layer 50a may be about the same as to about 5.0 eV less than the electron affinity ($EA_{50b}$) of the second charge-generation layer 50b. In an implementation, the ionization energy ($IE_{50a}$) of the first charge-generation layer 50a may be about 1.0 eV to 4.0 eV less than the electron affinity ($EA_{50b}$) of the second charge-generation layer 50b.

The first charge-generation layer 50a and the second charge-generation layer 50b may be formed of different materials from each other and each may be formed of undoped material. Accordingly, it is possible to advantageously decrease the voltage drop generated when using a doped material and omit the doping process entirely, so as to simplify a manufacturing process of the OLED device.

As an undoped pure material, the first charge-generation layer 50a may include, e.g., metal-substituted tetra(hexahydropyrimidopyrimidine) or a metal having low ionization energy.

The metal-substituted tetra(hexahydropyrimidopyrimidine) may include, e.g., ditungsten tetra(hexahydropyrimidopyrimidine) ($W_2(hpp)_4$), dichromium tetra(hexahydropyrimidopyrimidine) ($Cr_2(hpp)_4$), or a combination thereof. The metal having low ionization energy may include, e.g., a compound having an alkali metal, an alkali metal alloy, and/or compounds thereof, e.g., oxides, carbides, nitrides of the alkali metal, or the like. The alkali metal may include, e.g., lithium (Li), sodium (Na), cesium (Cs), rubidium (Rb), francium (Fr), or a combination thereof.

The second charge-generation layer 50b may include, e.g., a hexaazatriphenylene derivative, a tetrafluoro-tetracyanoquinodimethane (F4-TCNQ) derivative, a metal oxide, or a combination thereof. The metal oxide may include, e.g., vanadium oxide ($V_2O_5$), tungsten oxide ($WO_3$), molybdenum oxide ($MoO_3$), or a combination thereof.

In an implementation, the first charge-generation layer 50a may include, e.g., ditungsten tetra(hexahydropyrimidopyrimidine) ($W_2(hpp)_4$) having an ionization energy of about 3.51 eV, and the second charge-generation layer 50b may include, e.g., a hexaazatriphenylene(hexaazatriphenylene) derivative having an electron affinity of about 6.0 eV.

The organic light emitting diode device may include a plurality of pixels. Each pixel may include a plurality of sub-pixels. The pixels will be described below with reference to FIG. 3 and FIG. 4.

Figure 3:
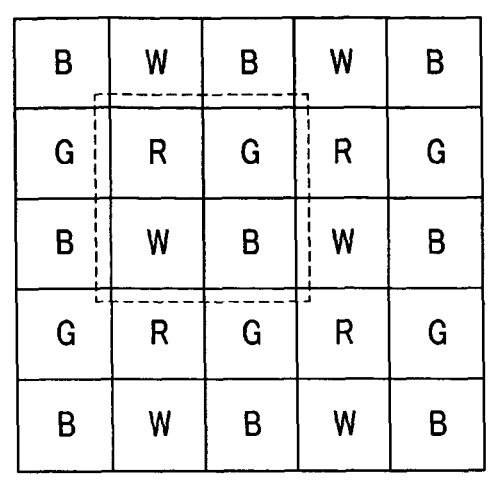
Figure 4:
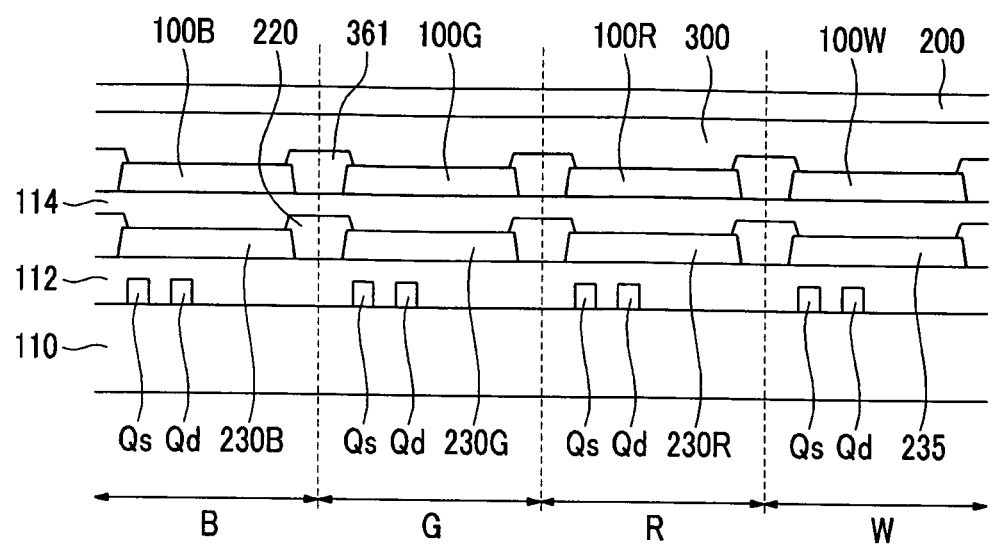
FIG. 4 illustrates a cross-sectional view of the structure of the organic light emitting diode device of FIG. 1.

FIG. 3 illustrates a top plan view of an arrangement of the plurality of pixels in the organic light emitting diode device according to an embodiment. FIG. 4 illustrates a cross-sectional view of the organic light emitting diode device according to an embodiment.

In the organic light emitting diode device according to the present embodiment, a red sub-pixel (R) displaying red light, a green sub-pixel (G) displaying green light, a blue sub-pixel (B) displaying blue light, and a white sub-pixel (W) displaying no color, i.e., white light, may be alternately disposed.

The red sub-pixel (R), the green sub-pixel (G), and the blue sub-pixel (B) may be primary pixels for displaying full color. The white sub-pixel (W) may increase light transmission and may enhance luminance of the device.

The four sub-pixels including the red sub-pixel (R), the green sub-pixel (G), the blue sub-pixel (B), and the white sub-pixel (W) may form one pixel. The pixel may be repeated along a row and/or a line. However, the arrangement of pixels may be varied.

A structure of an organic light emitting diode device including the red sub-pixel (R), the green sub-pixel (G), the blue sub-pixel (B), and the white sub-pixel (W) will be described with reference to FIG. 4.

A plurality of thin film transistor arrays may be disposed on an insulation substrate 110. The thin film transistor array may include a switching thin film transistor Qs and a driving thin film transistor Qd disposed in each sub-pixel and electrically connected to one another. FIG. 4 illustrates only one switching thin film transistor Qs and one driving thin film transistor Qd per a sub-pixel; but the embodiments are not limited thereto; and the transistors may be included in various numbers per sub-pixel.

A lower insulation layer 112 may be disposed on the thin film transistor array. A plurality of contact holes (not illustrated) may be disposed in the lower insulation layer 112 for partially exposing the switching thin film transistor Qs and the driving thin film transistor Qd.

On the lower insulation layer 112, a red filter 230R may be disposed in the red sub-pixel (R), a green filter 230G may be disposed in the green sub-pixel (G), and a blue filter 230B may be disposed in the blue sub-pixel (B). The color filters 230R, 230G, and 230B may be disposed in accordance with a color filter on array (CoA) scheme.

A transparent insulation layer 235 may be disposed in the white sub-pixel (W), instead of a color filter, in order to maintain an even plane with the color filters of the other sub-pixels. In an implementation, the transparent insulation layer 235 may be omitted.

A light blocking member 220 may be disposed between each of the red filter 230R, the green filter 230G, the blue filter 230B, and the transparent insulation layer 235. The light blocking member 220 may block light leakage between sub-pixels.

An upper insulation layer 114 may be disposed on the red filter 230R, the green filter 230G, the blue filter 230B, the transparent insulation layer 235, and the light blocking member 220. A plurality of contact holes (not illustrated) may be formed in the upper insulation layer 114.

Pixel electrodes 100R, 100G, 100B, 100W may be disposed on the upper insulation layer 114. The pixel electrodes 100R, 100G, 100B, 100W may be electrically connected to the driving thin film transistor Qd of the respective sub-pixel through a contact hole (not illustrated) and may include, e.g., the anode.

A plurality of insulation members 361 may be disposed between each pixel electrode 100R, 100G, 100B, 100W for defining each sub-pixel. An organic light emitting member 300 may be disposed on the pixel electrodes 100R, 100G, 100B, 100W and the insulation member 361.

As illustrated FIG. 1, the organic light emitting member 300 may include a first light emitting unit 20 including an emission layer 22 and auxiliary layers 21 and 23; a second light emitting unit 30 including an emission layer 32 and auxiliary layers 31 and 33; and a charge-generation layer 50 disposed between the first light emitting unit 20 and the second light emitting unit 30. However, the embodiments are not limited thereto and the organic light emitting member 300 may include, e.g., three or more light emitting units. In this case, a charge-generation layer may be disposed between each set of light emitting units.

The charge-generation layer 50 may include a first charge-generation layer 50a and a second charge-generation layer 50b. The first charge-generation layer 50a and the second charge-generation layer 50b may exhibit electron transport properties and hole transport properties, respectively. Each of the first charge-generation layer 50a and the second charge-generation layer 50b may be formed of, e.g., undoped material. Since the ionization energy of the first charge-generation layer 50a may be about the same as or less than the electron affinity of the second charge-generation layer 50b, it is possible to provide a junction structure that facilitates transporting electrons and holes in opposite directions. Accordingly, it is possible to decrease a voltage drop and thereby lower a driving voltage.

In an implementation, the organic light emitting member 300 may emit white light.

A common electrode 200 may be disposed on the organic light emitting member 300. The common electrode 200 may be formed on an entire surface of substrate and may include, e.g., a cathode. The common electrode 200 may facilitate flow of current to the organic light emitting member 300 by pairing with pixel electrodes 100R, 100G, 100B, 100W.

Hereinafter, current characteristics and photo characteristics of organic light emitting diode devices according to an Example and a Comparative Example will be described with reference to FIG. 5 and FIG. 6.

Figure 5:
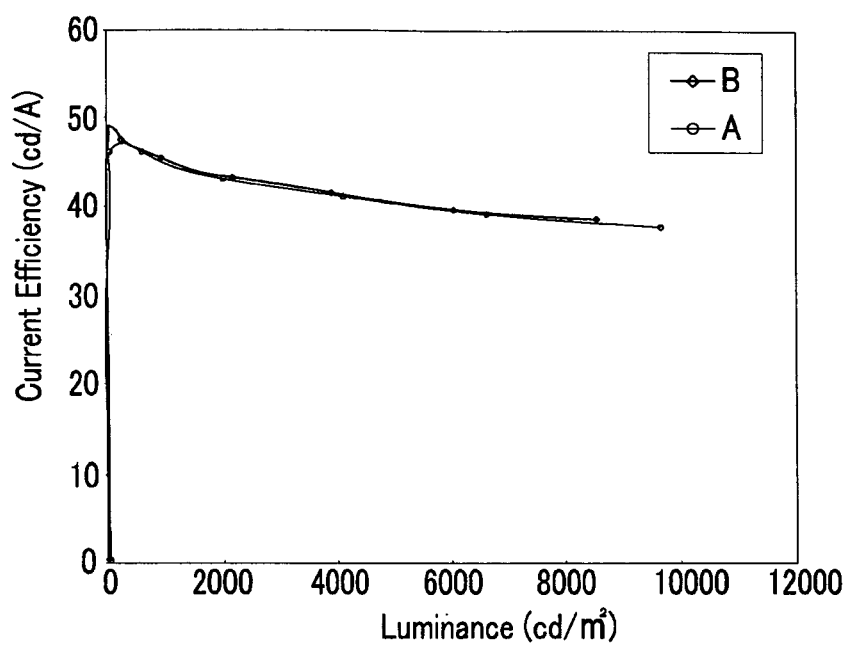
FIG. 5 illustrates a graph showing current efficiency depending upon luminance of organic light emitting diode devices according to an Example and a Comparative Example.

FIG. 5 illustrates a graph showing current efficiency of an organic light emitting diode device according to an embodiment depending upon luminance. FIG. 6 illustrates a graph showing photo intensity/current density of an organic light emitting diode device according to an embodiment depending upon wavelength.

In the organic light emitting diode device according to the Example (A), the first charge-generation layer in the organic light emitting diode device was formed of ditungsten tetra (hexahydropyrimidopyrimidine) ($W_2(hpp)_4$) to have a thickness of 150 Å. The second charge-generation layer was formed of hexaazatriphenylene to have a thickness of 450 Å.

In the organic light emitting diode device according to the Comparative Example (B), the first charge-generation layer as formed of Alq3 doped with NDN1 (manufactured by Novaled) instead of ditungsten tetra(hexahydropyrimidopyrimidine) ($W_2(hpp)_4$). The second charge-generation layer was formed in accordance with the same procedure as in the Example, except that hexaazatriphenylene was used.

Referring to FIG. 5, it may be that the organic light emitting diode device (A) according to the Example exhibited excellent current efficiency in a wide luminance range, which was similar to the organic light emitting diode device (B) according to the Comparative Example. In addition, it may also be seen that the organic light emitting diode device (A) according to the Example exhibited excellent charge-generation characteristics in the wide current range, since it rarely exhibited roll-off characteristics.

Figure 6:
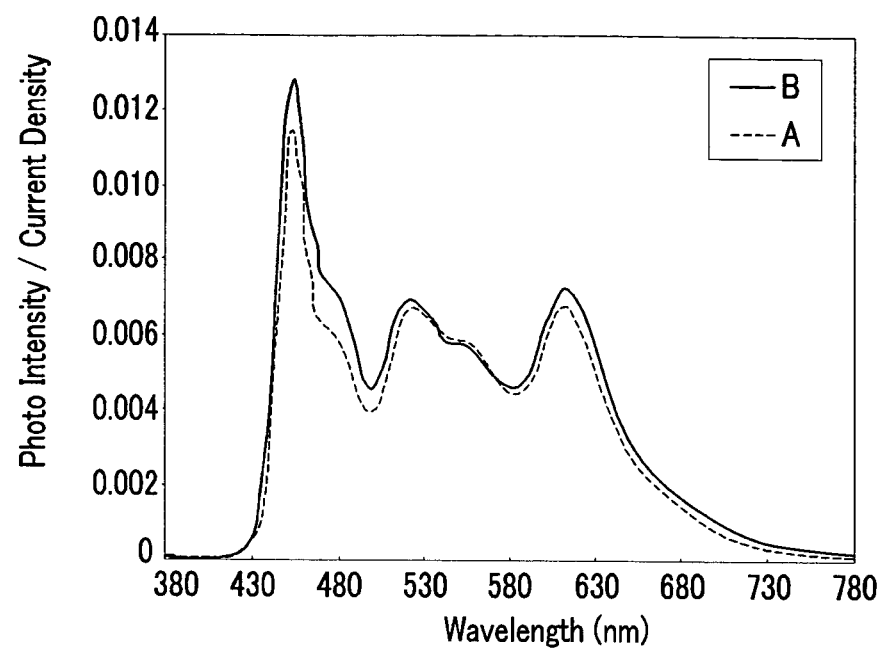
FIG. 6 illustrates a graph showing photo intensity/current density of organic light emitting diode devices depending upon the wavelength.

Referring to FIG. 6, it may be seen that the organic light emitting diode device (A) according to the Example exhibited white light emitting characteristics similar to the organic light emitting diode device (B) according to the Comparative Example.

Hereinafter, current characteristics of the organic light emitting diode device according to the Example will be compared to those of the OLED device according to the Comparative Example.

TABLE 1

| | Driving voltage (V) | Current efficiency (cd/A) | Photo efficiency (lm/W) | Color coordinate CIE-x | CIE-y |
|---|---|---|---|---|---|
| Example (A) | 6.49 | 41.2 | 19.95 | 0.32 | 0.33 |
| Comparative Example (B) | 7.03 | 41.2 | 18.43 | 0.32 | 0.33 |

As shown in Table 1, the organic light emitting diode device according to the Example exhibited a similar current efficiency and color coordinate to the Comparative Example. However, the OLED device according to the Example exhibited a driving voltage about 0.5 V lower than that of the OLED device according to the Comparative Example as well as improved photo efficiency. In other words, the OLED device according to an embodiment may exhibit the same excellent current efficiency and photo efficiency as that of the Comparative Example but at a lower, i.e., a more efficient, driving voltage.

Current characteristics and luminance will be described with reference to FIG. 7 and FIG. 8.

Figure 7:
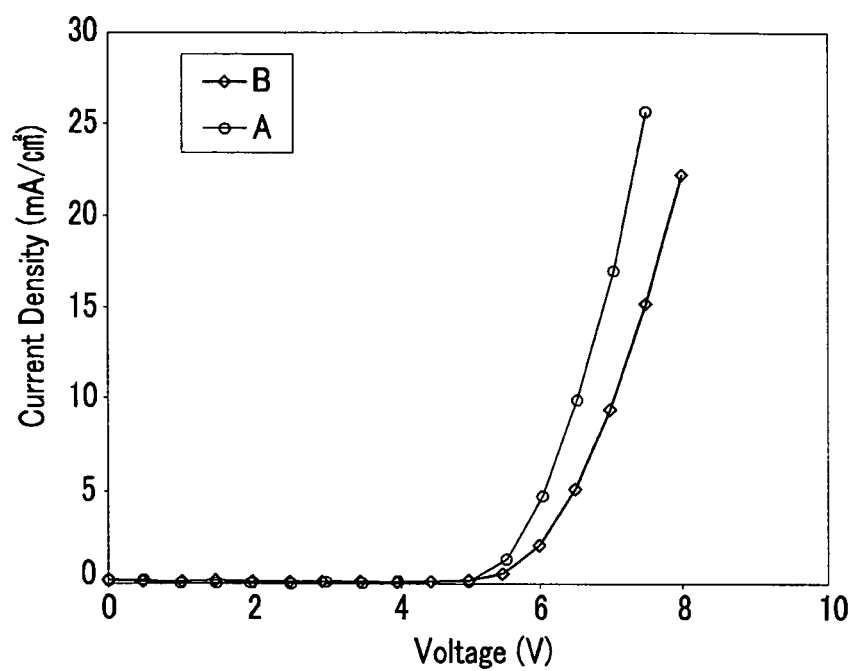
FIG. 7 illustrates a graph showing current density of organic light emitting diode devices according to an Example and a Comparative Example depending upon voltage.

FIG. 7 illustrates a graph showing current density of organic light emitting diode devices according to the Example and the Comparative Example depending upon voltage. FIG. 8 illustrates a graph showing luminance of organic light emitting diode devices according to the Example and the Comparative Example depending upon voltage.

Figure 8:
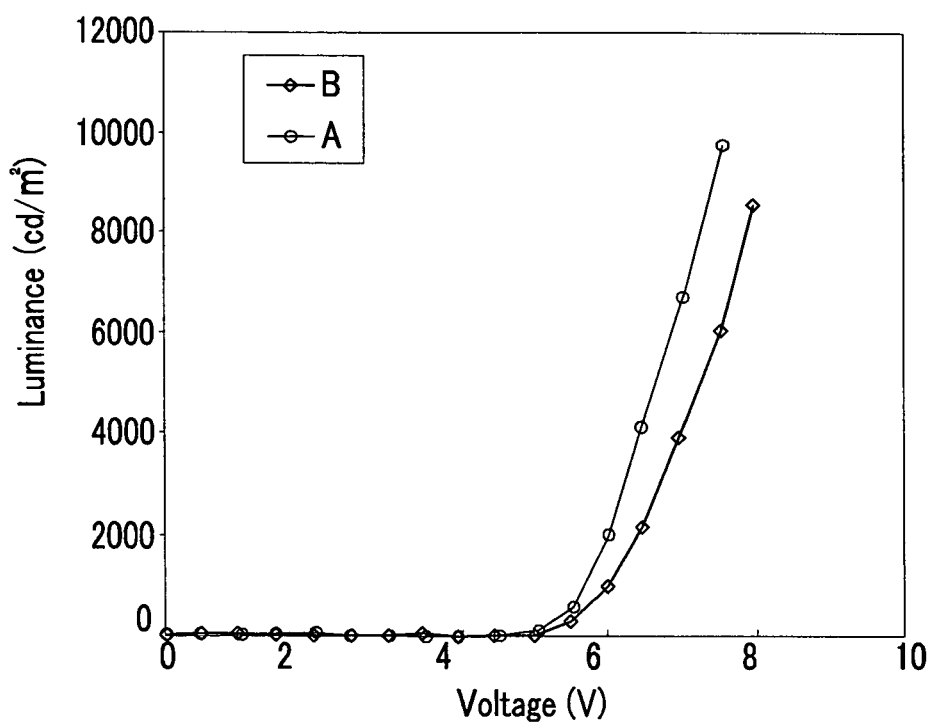
FIG. 8 illustrates a graph showing luminance of organic light emitting diode devices according to an Example and a Comparative Example depending upon voltage.

Referring to FIG. 7 and FIG. 8, it may be seen that the organic light emitting diode device (A) according to the Example exhibited higher current density and luminance than the organic light emitting diode device (B) according to the Comparative Example.

Since the organic light emitting diode device according to an embodiment may have a junction structure that facilitates transmitting electrons and holes in the charge-generation layer, it is possible to decrease a voltage drop, thereby lowering a driving voltage as well as improving current density and luminance at the same voltage.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode device, comprising:
an anode;
a cathode facing the anode; and
a light emitting member between the anode and cathode;
wherein the light emitting member includes:
at least two light emitting units displaying the same or different color as one another, and
a charge-generation layer between the at least two light emitting units, the charge-generation layer including a first charge-generation layer and a second charge-generation layer that each are formed from an undoped material, and wherein:
the first charge-generation layer has an ionization energy that is about the same as or less than an electron affinity of the second charge-generation layer, and
the first charge-generation layer includes a metal-substituted tetra(hexahydropyrimidopyrimidine).

2. The organic light emitting diode device as claimed in claim 1, wherein the first charge-generation layer has an electron transport property and the second charge-generation layer has a hole transport property.

3. The organic light emitting diode device as claimed in claim 2, wherein the first charge-generation layer is between the anode and the second charge-generation layer.

4. The organic light emitting diode device as claimed in claim 2, wherein the at least two light emitting units include:
a first light emitting unit between the anode and the first charge-generation layer; and
a second light emitting unit between the cathode and the second charge-generation layer.

5. The organic light emitting diode device as claimed in claim 2, wherein the first charge-generation layer and the second charge-generation layer include different materials from one another.

6. The organic light emitting diode device as claimed in claim 5, wherein the ionization energy of the first charge-generation layer is from about the same as to about 5 eV less than the electron affinity of the second charge-generation layer.

7. The organic light emitting diode device as claimed in claim 6, wherein the ionization energy of the first charge-generation layer is from about 1 eV less than to about 4 eV less than the electron affinity of the second charge-generation layer.

8. The organic light emitting diode device as claimed in claim 5, wherein the ionization energy of the first charge-generation layer is about 2.0 eV to about 5.0 eV and the electron affinity of the second charge-generation layer is about 4.0 eV to about 7.0 eV.

9. The organic light emitting diode device as claimed in claim 5, wherein the second charge-generation layer includes at least one of a hexaazatriphenylene derivative, a tetrafluoro-tetracyanoquinodimethane (F4-TCNQ) derivative, and a metal oxide.

10. The organic light emitting diode device as claimed in claim 9, wherein the second charge-generation layer includes the metal oxide, such metal oxide including at least one of vanadium oxide ($V_2O_5$), tungsten oxide ($WO_3$), and molybdenum oxide ($MoO_3$).

11. The organic light emitting diode device as claimed in claim 2, wherein each light emitting unit includes:
an emission layer displaying color; and
an auxiliary layer disposed on at least one of an upper side and a lower side of the emission layer.

12. The organic light emitting diode device as claimed in claim 2, wherein the light emitting member includes at least one of a red light emitting unit, a green light emitting unit, a blue light emitting unit, an orange light emitting unit, and a white light emitting unit.

13. The organic light emitting diode device as claimed in claim 12, wherein the light emitting member includes the orange light emitting unit, such orange light emitting unit including a red emission layer and a green emission layer.

14. The organic light emitting diode device as claimed in claim 12, wherein the light emitting member includes the orange light emitting unit, such orange light emitting unit including a host doped with red light emitting material and green light emitting material.

15. The organic light emitting diode device as claimed in claim 2, wherein the light emitting member is fashioned to emit white light by combining light emitted from the at least two light emitting units.

16. The organic light emitting diode device as claimed in claim 2, further comprising a first sub-pixel, a second sub-pixel, and a third sub-pixel displaying different colors from each other and a white sub-pixel,
   wherein the light emitting member is commonly disposed on the first sub-pixel, the second sub-pixel, the third sub-pixel, and the white sub-pixel; and
   wherein the first sub-pixel, the second sub-pixel, and the third sub-pixel include a red color filter, a green color filter, and a blue color filter, respectively, disposed on a lower side or an upper side of the light emitting member.

17. The organic light emitting diode device as claimed in claim 1, wherein the metal-substituted tetra(hexahydropyrimidopyrimidine) includes at least one of ditungsten tetra(hexahydropyrimidopyrimidine) ($W_2(hpp)_4$) and dichromium tetra(hexahydropyrimidopyrimidine) ($Cr_2(hpp)_4$).

18. The organic light emitting diode device as claimed in claim 1, wherein the first charge-generation layer consists essentially of a metal-substituted tetra(hexahydropyrimidopyrimidine).

* * * * *